(12) United States Patent
Setlur et al.

(10) Patent No.: US 7,327,078 B2
(45) Date of Patent: Feb. 5, 2008

(54) LED ILLUMINATION DEVICE WITH LAYERED PHOSPHOR PATTERN

(75) Inventors: Anant Achyut Setlur, Niskayuna, NY (US); Joseph John Shiang, Niskayuna, NY (US); Alok Mani Srivastava, Niskayuna, NY (US); Holly Ann Comanzo, Niskayuna, NY (US); Stanton Earl Weaver, Northville, NY (US); Charles Adrian Becker, Schenectady, NY (US)

(73) Assignee: Lumination LLC, Valley View, OH (US)

( * ) Notice: Subject to any disclaimer, the term of this patent is extended or adjusted under 35 U.S.C. 154(b) by 348 days.

(21) Appl. No.: 10/813,338

(22) Filed: Mar. 30, 2004

(65) Prior Publication Data

US 2005/0227388 A1 Oct. 13, 2005

(51) Int. Cl.
*H05B 33/00* (2006.01)

(52) U.S. Cl. .................. 313/499; 313/503; 313/512

(58) Field of Classification Search ............... None
See application file for complete search history.

(56) References Cited

U.S. PATENT DOCUMENTS

| 5,813,753 | A | | 9/1998 | Vriens et al. |
| 6,066,861 | A | | 5/2000 | Höhn et al. |
| 6,155,699 | A | * | 12/2000 | Miller et al. ................ 362/293 |
| 6,274,890 | B1 | | 8/2001 | Oshio et al. |
| 6,466,135 | B1 | * | 10/2002 | Srivastava et al. ........ 340/815.4 |
| 6,501,100 | B1 | * | 12/2002 | Srivastava et al. ............ 257/79 |
| 6,621,211 | B1 | * | 9/2003 | Srivastava et al. .......... 313/503 |
| 6,844,671 | B2 | * | 1/2005 | Setlur et al. ................ 313/503 |
| 2004/0056990 | A1 | * | 3/2004 | Setlur et al. .................. 349/69 |

* cited by examiner

*Primary Examiner*—Ashok Patel
(74) *Attorney, Agent, or Firm*—Fay Sharpe LLP

(57) ABSTRACT

A method of applying at least two phosphors to an LED, wherein a first phosphor material having a lower absorption, shorter luminescence decay time, and/or lower thermal quenching than a second phosphor material is positioned closer to the LED than the second phosphor. Such an arrangement provides a light emitting device with improved lumen output and color stability over a range of drive currents.

17 Claims, 4 Drawing Sheets

LED ILLUMINATION DEVICE WITH LAYERED PHOSPHOR PATTERN

BACKGROUND

The present exemplary embodiments relate to a method for layering phosphors in a light emitting diode ("LED") device to minimize non-radiative loss mechanisms in the phosphor layer. It finds particular application in conjunction with LEDs, and will be described with particular reference thereto. However, it is to be appreciated that the present exemplary embodiment is also amenable to other like applications.

Light emitting diodes ("LEDs") are well-known solid state devices that can generate light having a peak wavelength in a specific region of the light spectrum. LEDs are typically used as illuminators, indicators and displays. However, the potential for general illumination is also enormous. Originally, the most efficient LEDs emitted light having a peak wavelength in the red region of the light spectrum, i.e., red light. However, a type of LED based on a gallium nitride (GaN) die has also been developed that can efficiently emit light having a peak wavelength in the blue and/or UV region of the spectrum. This type of LED can now provide significantly brighter output light.

Since blue and UV light have a shorter peak wavelength than red light, the blue/UV light generated by a GaN-based LED die can be readily converted to light having a longer peak wavelength. It is well known in the art that light having a first peak wavelength (the "primary light") can be converted into light having a longer peak wavelength (the "secondary light") using a process known as phosphorescence. The phosphorescence process involves the absorption of the primary light by a photoluminescent phosphor material, which acts to excite the atoms of the phosphor material to emit the secondary light. The peak wavelength of the secondary light will depend on the phosphor material. The type of phosphor material can be chosen to yield secondary light having a particular peak wavelength.

According to U.S. Pat. No. 5,998,925, a phosphor comprised of $(Y_{0.4}Gd_{0.6})_3 Al_5O_{12}:Ce$, for example, is used to convert a portion of a blue emitted light from a GaN die to yellow light. The total emission of the LED device, consisting of blue GaN device generated light and yellow phosphor emitted light is a generally white light. According to U.S. Pat. No. 6,522,065, a similar result can be achieved using a UV emitting GaN die. In this patent a phosphor comprised of $Ca_{1.94}Na_{1.03}Eu_{0.03}Mg_2V_3O_{12}$, for example, is used to convert at least a substantial portion of the GaN emitted UV light to white light.

There are three primary problems in the white LED lamps described above, which are particularly present in UV-LED devices. First, if the absorption of the phosphor at the emitted UV wavelength is not high, then there is a significant amount of radiation emitted from the die that bleeds through the phosphor coating. Since the eye does not perceive UV radiation well, the overall lumen output of the lamp is reduced. Similarly, too much blue light bleed-through disturbs the lamp color. Second, for phosphors with slow decay times (>3 ms), the high fluxes present in the UV-LED device can lead to non-linear quenching effects from large excited steady state population. The resulting reduction of light output efficiency is referred to as saturation that reduces the lumen output of the device. Third, the heating of the phosphor particles situated immediately on top of or adjacent the LED chip by the LED leads to reduced efficiency (a phenomenon known as thermal quenching).

The present invention provides an LED device which helps to minimize each of these problems.

BRIEF DESCRIPTION

In accordance with a first aspect of the present exemplary embodiments, there is provided a method of forming a light emitting device including depositing a first phosphor material over a semiconductor light emitter and depositing a second phosphor material over the first phosphor material, wherein the first phosphor material has at least one of a shorter decay time and a lower absorption of radiation from the semiconductor light emitter than the second phosphor material.

In accordance with a second aspect of the present exemplary embodiment, there is provided a light emitting device including a semiconductor light emitter and at least two phosphor materials. The first phosphor material is disposed closer to the light emitting diode or laser diode than a second phosphor material. The second phosphor material is selected to have a decay time greater than the decay time of the first phosphor material. Alternatively, the first phosphor material can demonstrate a lesser efficiency to absorb the light emitted by the light emitting diode or laser than the second phosphor material.

In accordance with a third aspect of the present exemplary embodiments, there is provided a light emitting device including a light emitting diode or laser emitting diode and at least two phosphor materials, wherein a first phosphor material is positioned such that radiation emitted from the light emitting diode or laser emitting diode strikes the first phosphor material prior to striking the second phosphor material, and further wherein the first phosphor material has at least one of a shorter decay time and a lower absorption of radiation emitted from the light emitting diode or laser emitting diode than the second phosphor material.

In a fourth embodiment of the present exemplary embodiments, there is provided a light emitting device including a semiconductor light emitter and at least two phosphor materials. The first phosphor material is disposed closer to the light emitting diode or laser diode than a second phosphor material. The first phosphor material is selected to have a lower thermal quenching than the second phosphor material.

According to one specific embodiment, the first phosphor is selected from the group consisting of: $(Ba,Sr,Ca)Al_2O_4:Eu^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Ca,Sr,Ba,Mg)_{10}(PO_4)_6(F,Cl,Br,OH):Eu^{2+}$ $(Ca,Sr)_8(Mg,Zn)(SiO_4)_4Cl_2:Eu^{2+}$; $(Sr,Ca,Ba,Mg)_{10}(PO_4)_6(F,Cl,Br,OH):Eu^{2+}$ (SECA); $(Ba,Sr,Ca)MgAl_{10}O_{17}:Eu^{2+}$ (BAM); $(Sr, Ca)_{10}(PO_4)_6*nB_2O_3:Eu^{2+}$; $2SrO*0.84P2O_5*0.16B_2O_3$: $Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$ (SAE); $BaAl_8O_{13}:Eu^{2+}$; and $(Y,Gd,Tb,La,Sm,Pr,Lu)_3(Al,Ga)_5O_{12}:Ce^{3+}$.

According to another specific embodiment, the second phosphor is selected from the group consisting of: $(Ba,Sr,Ca)MgAl_{10}O_{17}:Eu^{2+},Mn^{2+}$ (BAMn); $(Sr,Ca,Ba,Mg,Zn)_2P_2O_7:Eu^{2+}, Mn^{2+}$ (SPP); $(Ca,Sr,Ba,Mg)_{10}(PO_4)_6(F,Cl,Br,OH):Eu^{2+},Mn^{2+}$(HALO); $(Ca,Sr)_8(Mg,Zn)(SiO_4)_4Cl_2:Eu^{2+},Mn^{2+}$(CASI); $(Ba,Sr,Ca)MgP_2O_7:Eu^{2+},Mn^{2+}$; $3.5MgO*0.5MgF_2*GeO_2:Mn^{4+}$(MFG).

DETAILED DESCRIPTION

Figure 1:
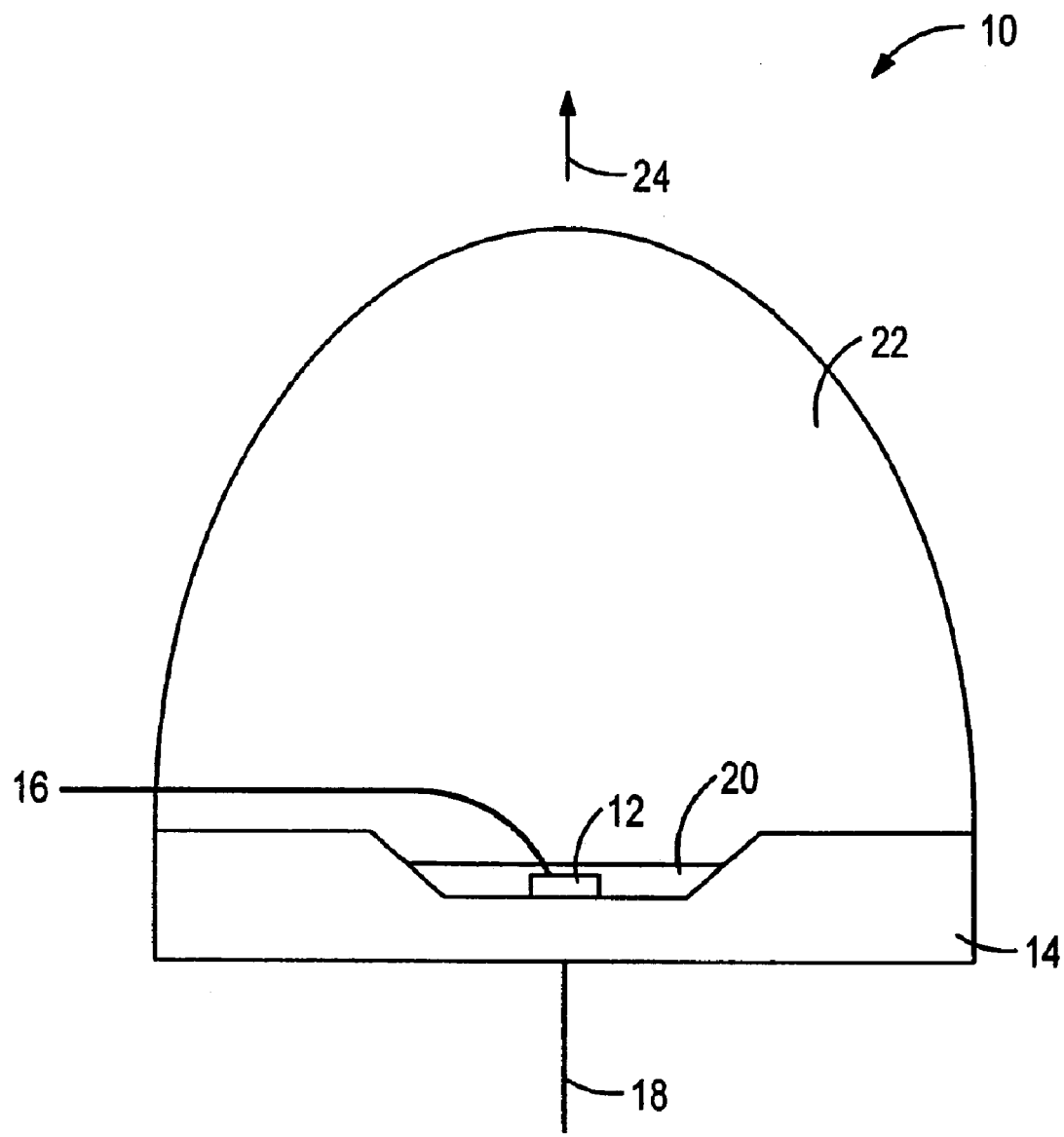
FIG. 1 is a schematic sectional view of a prior art LED device.

With reference to FIG. 1, an exemplary phosphor-conversion light emitting device or lamp 10 is shown. The light emitting device 10 comprises a semiconductor UV or blue radiation source, such as a light emitting diode (LED) chip or die 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation. The die 12 is covered by a phosphor containing layer 20.

The phosphor containing layer 20 may contain a phosphor material and an encapsulant. The encapsulant is preferably an epoxy, plastic, low temperature glass, polymer, thermoplastic, thermoset material, resin or other type of LED encapsulating material as is known in the art. Optionally, the encapsulant is a spin-on glass or some other high index of refraction material. Preferably, the encapsulant material is an epoxy or a polymer material, such as silicone. The phosphor material utilized in the layer 20 can vary, depending upon the desired color of secondary light that will be generated by the region 20. The die 12 and the phosphor containing layer 20 are encapsulated by a lens 22.

The device may include any semiconductor blue or UV light source that is capable of producing white light when its emitted radiation is directed onto the phosphor. In a preferred embodiment, the semiconductor light source comprises a blue emitting LED doped with various impurities. Thus, the LED may comprise a semiconductor diode based on any suitable III-V, II-VI or IV-IV semiconductor layers and preferably has an emission wavelength of about 250 to 500 nm. Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

Organic light emissive structures are known in the art. A common high-efficiency organic emissive structure is referred to as the double heterostructure LED. This structure is very similar to conventional, inorganic LED's using materials as GaAs or InP. In this type of device, a support layer of glass is coated by a thin layer of indium/tin oxide (ITO) to form the substrate for the structure. Next, a thin (100-500 Å) organic, predominantly hole-transporting, layer (HTL) is deposited on the ITO layer. Deposited on the surface of the HTL layer is a thin (typically, 50-100 Å) emissive layer (EL). If these layers are too thin, there may be breaks in the continuity of the film; as the thickness of the film increases, the internal resistance increases, requiring higher power consumption for operation. The emissive layer (EL) provides the recombination site for electrons, injected from a 100-500 Å thick electron transporting layer (ETL) that is deposited upon the EL, and holes from the HTL layer. The ETL material is characterized by considerably higher mobility for electrons than for charge deficient centers (holes).

In operation, electrical power is supplied to the die 12 to activate it. When activated, the die 12 emits the primary light away from its top surface. The emitted primary light is absorbed by the phosphor containing layer 20. The phosphor layer 20 then emits a secondary light, i.e., converted light having a longer peak wavelength, in response to absorption of the primary light. The secondary light is emitted randomly in various directions by the phosphor in the layer 20. Some of the secondary light is emitted away from the die 12, propagating through the lens 22 and exiting the device 10 as output light. The lens 22 directs the output light in a general direction indicated by arrow 24.

One disadvantage of the design of FIG. 1, when a UV LED chip is used, is that if the absorption of the phosphor at the specified UV wavelength is not high, then there is a significant amount of incident UV radiation that bleeds through the phosphor coating. Since the human eye does not perceive UV light well, the overall lumen output of the device is reduced.

Another possible disadvantage with this design is that certain phosphors with high thermal quenching will have a reduced efficiency when the phosphor particles are heated. Thus, when placed close to a hot LED chip, the use of such phosphors will reduce the overall efficiency of the device.

Another disadvantage is that in phosphors with slow decay times (i.e. long luminescence lifetimes), the high fluxes present in certain LEDs lead to a large excited steady state population. This leads to saturation of the available phosphor and degrade the luminescent efficiency of the phosphor, leading to reduced lumen output. In addition, at high LED drive currents, the larger UV flux tends to degrade the luminescence efficiency of these phosphors even further, leading to severe changes in the device color point for different drive currents. This is especially a problem for UV-LED phosphors. For example, in the $Eu^{2+}$—$Mn^{2+}$ energy transfer phosphors, which are commonly used with UV emitting LED chips, the incident UV light from the chip is absorbed by $Eu^{2+}$ ions and that energy is then transferred to $Mn^{2+}$, leading to green, yellow, orange, or red emission from $Mn^{2+}$. The main problem lies in the slow decay time of $Mn^{2+}$ (>10 ms) which makes it susceptible to a saturation effect. This problem is exacerbated in phosphors with high absorptions, i.e. the type preferably used to reduce incident UV bleedthrough. Consequently, there is a trade-off between UV-bleedthrough and saturation in the set of UV-LED phosphors that are based upon the $Eu^{2+}$—$Mn^{2+}$ energy transfer couple, thereby reducing the efficiency of these lamps.

Generally, the present invention provides a phosphor layering strategy which improves the lumen output and color stability of LED based lamps that work by converting LED radiation into a desired color by the choice of appropriate phosphors. The strategy is believed to be particularly effective with LEDs emitting between 350-440 nm but is not limited thereto.

According to one of the present embodiments, at least two different kinds of phosphor particles, which exhibit different absorption/emission characteristics, are dispersed in at least two separate layers adjacent the LED. The phosphor layers, encapsulant and lens elements can be comprised of any material known by the skilled artisan, such as, for example, silicone, epoxy and mixtures thereof.

Figure 2:
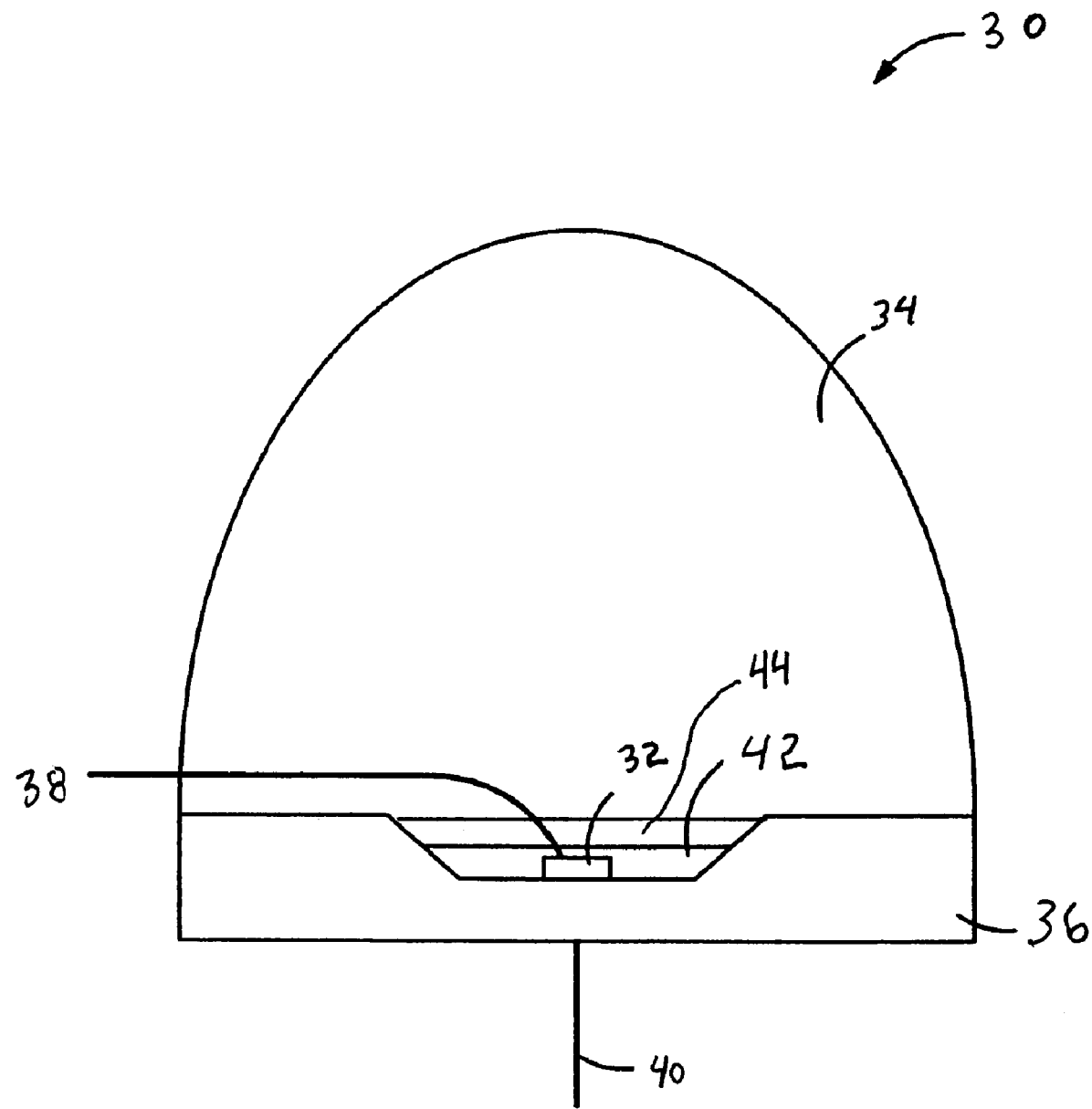
FIG. 2 is a schematic sectional view of an LED device in accord with a first embodiment.

Referring now to FIG. 2, a light-emitting device 30 according to one embodiment of the present invention is shown, including a radiation-emitting semiconductor body (such as an LED or laser diode) 32 at least partly enclosed by an encapsulant 34. As with a traditional LED light emitting device, the semiconductor body 32 is located within reflector cup lead frame 36 and powered via conductive leads 38 and 40. A first phosphor material is disposed in a first layer 42 comprised of, for example, silicone or one of the other materials mentioned with reference to FIG. 1. The first layer 42 is positioned between the LED chip and second layer 44, containing a second phosphor material. In the present description, although reference may be made to a single phosphor composition in each layer, it should be appreciated that both the first and second phosphor materials may contain two or more different phosphor compositions.

Figure 3:
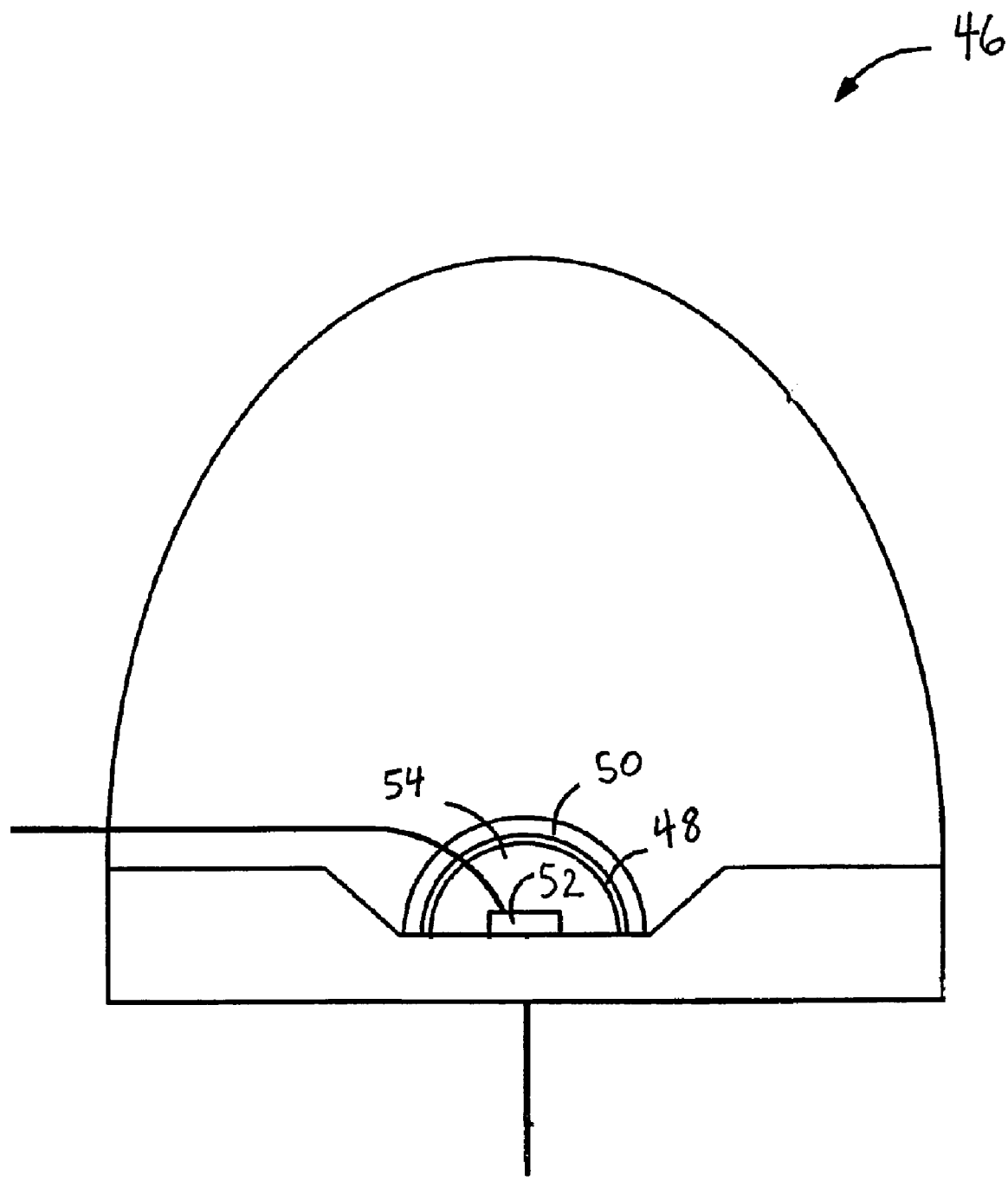
FIG. 3 is a schematic sectional view of an LED device in accord with a second embodiment.

Further, although reference is made to two separate phosphor layers distinct from the encapsulant, the exact position of the phosphor material is not critical and thus may be, in fact, embedded in the encapsulant or coated on the lens element. In such a case, the two phosphor layers 42, 44 would not be distinct from the encapsulant. In fact, the invention does not envision any limitation with respect to the particular location of phosphor materials except that, regardless of where or how the phosphors are positioned in the device, a majority of the first phosphor particles are preferably positioned closer to the LED chip, or otherwise designed to receive incident light from the LED chip prior to the second phosphor material. Thus, for example, with reference to FIG. 3, a light emitting device 46 is shown in which first and second phosphor containing layers 48, 50 are positioned as hemispheres a specified distance away from the LED chip 52 leaving a gap 54.

The first phosphor is selected to have a faster luminescence decay time and/or a lower absorption of LED emitted light than the phosphor included in the second phosphor material. Preferably, the first phosphor will also have a greater efficiency (i.e. lower thermal quenching) under elevated temperatures, such as those experienced by the LED chip when activated.

While the present embodiment shows two phosphor layers, the invention is not limited to such and embodiments are contemplated containing three or more phosphor layers. Advantageously, a semiconductor component in accord with this invention can be manufactured using conventional production lines.

The color temperature or color location of the generated light can be varied by a suitable choice of the phosphor material, particle size, and its concentration. In addition, luminous substance mixtures can also be employed, and as one advantageous result, the desired tonality of the color of the emitted light can be adjusted precisely.

As detailed above, the layer(s) closest to the LED use phosphor(s) that have a faster decay time and or a lower absorption of incident light (i.e. plaque absorptions (A)) emitted by the LED chip than phosphor(s) used in a second layer positioned further away from the LED chip. Plaque absorption, A, is the percentage of radiation striking a sample plaque of a phosphor material perpendicular to its surface (at 0° angle of incidence) that is absorbed. Thus, for example, phosphors used in the first layer may have decay times on the order of about 1 ms or less and/or have an absorption of incident radiation from the specific LED chip used of from about 30%<A<65% for median particle sizes of ~10 μm. Of course, the absorption of a specific phosphor will vary based on the wavelength of emitted radiation. Thus, the phosphor materials in the two layers must be selected with reference to an LED chip emitting in a specified range. The selection of these phosphors will minimize saturation effects due to a high excited state population of ions within the phosphor layers, closest to the LED, where the incident flux is highest. The phosphor layer(s) further away from the LED can then use phosphors that have slower decay times (>3 ms) and/or have higher absorption of incident LED radiation.

The use of highly absorbing $Eu^{2+}$—$Mn^{2+}$ phosphors in the layers further away from the LED is especially useful because it helps to ensure a significant portion of the incident light that bleeds through the initial phosphor layers gets converted into useful visible light, increasing the efficiency of the LED device. If these phosphors were placed close to the LED, phosphor saturation effects from high incident light fluxes significantly reduce the quantum efficiency (QE) of the phosphor, leading to a lamp with a lower lumen output. However, in accord with the present layering strategy, the phosphor layer(s) closest to the LED absorb and scatter the incident radiation, thereby reducing the flux on the phosphor layer(s) further away from the LED. Consequently, phosphor saturation effects are significantly reduced and the phosphor layers that are away from the LED have higher QEs. This will improve the lumen output of the LED lamp.

One exemplary phosphor layering strategy for a UV LED chip, utilizes a first layer that is a white light blend where some of the phosphors can be based on $Eu^{2+}$—$Mn^{2+}$ phosphors that have a relatively low absorption of UV-LED radiation. A specific example of this is a white light blend based upon $(Sr, Ca,Ba,Mg,Zn)_2P_2O_7:Eu^{2+}, Mn^{2+}$ (SPP) and $Sr_4Al_{14}O_{25}: Eu^{2+}$ (SAE). The decay time of $Mn^{2+}$ in SPP is slow ~14 ms, but its plaque absorption is rather low (60% at median particle size of 10 microns). The decay time of the SAE phosphor is ~1 microsecond. Consequently, saturation effects in this blend due to high light fluxes would be acceptably low. However, the low absorption of SPP leads to significant UV bleedthrough that might otherwise reduce the efficiency of these lamps if no additional phosphors were used.

In the exemplary embodiment, the second phosphor layer further away from the LED chip can be $(Ca,Sr,Ba,Mg)_{10}(PO_4)_6(F,Cl,Br,OH):Eu^{2+},Mn^{2+}$ (HALO). This phosphor has a high absorption of UV light (about 80% at median particle size of 10 microns) with a $Mn^{2+}$ decay time of ~11 ms. When HALO is used in blends in typical phosphor laydown procedures, it severely saturates and the phosphor quantum efficiency (QE) and lamp output is rather low. However, when coated on top of the SPP/SAE layer, there is a reduced light flux on the HALO particles, reducing the negative effects of the slow decay time. The high absorption results in a QE of HALO that is quite high. Combining the phosphors in the present layering strategy allows improved performance in both phosphors to be achieved. While this UV-LED example is provided to help explain the invention, the invention is also encompasses any type of light emitting diode and can be effective with any wavelength of light generated.

One exemplary LED chip is formed with a first cladding layer such as GaN disposed on a substrate, such as Si, or sapphire and has a structure of n-Al$_w$Ga$_{(1-w)}$N. An optional n-GaN cladding layer may also be added. An active layer including InGaN multiple quantum well layer is formed next. Disposed on the active layer is a series of optional p-type cladding layers such as p-Al$_v$Ga$_{(1-v)}$N structure, a p-Al$_v$Ga$_{(1-v)}$N cladding layer and a p-GaN cladding layer. To complete the structure, metallic contacts are formed on the top (p-type) and bottom (n-type) surfaces. To form a laser diode, reflective surfaces can be formed along opposing edges to define the laser cavity. A suitable composition for the p-type contact is nickel-gold, either alloyed or with a nickel-rich composition in contact with the p-GaN layer and a gold rich composition in contact with the nickel-rich layer. A suitable composition for the n-type contact is titanium-aluminum, either alloyed or with a titanium-rich composition in contact with the substrate and an aluminum-rich composition in contact with the titanium rich layer. The contacts may be deposited by any means known in the art.

More complicated strategies can also be designed. In this respect, additional phosphor layers may be added as described above. Exemplary layering strategies (order from the LED out) include those detailed below. These examples are not meant to be limiting but only instructive in the potential choices for phosphor layering strategies. Phosphors for use in these examples can be described as:
1. Phosphors having a high absorption of LED radiation, and short luminescence decay time.
2. Phosphors having a lower absorption and short decay times.
3. Phosphors having a lower absorption and long decay times.
4. Phosphors having a higher absorption and long decay times.

Thus, one example of a phosphor layering strategy would be a phosphor from group 1 adjacent to the LED chip and a phosphor from group 2 positioned further away from the LED chip. Such a strategy could be denoted "1-2" (as ordered from the LED out). Other non-limiting examples of phosphors layering strategies include: 1-3, 1-4, 2-3, 2-4, 1-2-3, 1-2-4, 2-3-4, 1-2-3-4, 1-4-3, and 2-4-3. Other layering strategies are also possible. Examples of phosphors that can be grouped in the above categories for purposes of the present embodiments include.

Group 1
(Ba,Sr,Ca)Al$_2$O$_4$:Eu$^{2+}$
(Ba,Sr,Ca)$_2$SiO$_4$:Eu$^{2+}$
(Ba,Sr,Ca)$_2$(Mg,Zn)Si$_2$O$_7$:Eu$^{2+}$
(Sr,Ca,Ba)(Al,Ga,In)$_2$S$_4$:Eu$^{2+}$
(Ca,Sr,Ba,Mg)$_{10}$(PO$_4$)$_6$(F,Cl,Br,OH):Eu$^{2+}$
(Ca ,Sr)$_8$(Mg,Zn)(SiO$_4$)$_4$Cl$_2$: Eu$^{2+}$ Group 2
(Sr,Ca,Ba,Mg)$_{10}$(PO$_4$)$_6$(F,Cl,Br,OH):Eu$^{2+}$ ("SECA")
(Ba,Sr,Ca)MgAl$_{10}$O$_{17}$:Eu$^{2+}$ ("BAM")
(Sr,Ca)$_{10}$(PO$_4$)$_6$*nB$_2$O$_3$: Eu$^{2+}$
2SrO*0.84P$_2$O$_5$*0.16B$_2$O$_3$:Eu$^{2+}$
Sr$_2$Si$_3$O$_8$*2SrC$_2$: Eu$^{2+}$
Ba$_3$MgSi$_2$O$_8$:Eu$^{2+}$
Sr$_4$Al$_{14}$O$_{25}$:Eu$^{2+}$("SAE")
BaAl$_8$O$_{13}$:Eu$^{2+}$
(Y,Gd,Tb,La,Sm,Pr,Lu)$_3$(Al,Ga)$_5$O$_{12}$:Ce$^{3+}$ Group 3
(Ba,Sr,Ca)MgAl$_{10}$O$_{17}$:Eu$^{2+}$,Mn$^{2+}$ ("BAMn")
(Sr,Ca,Ba,Mg,Zn)$_2$P$_2$O$_7$:Eu$^{2+}$, Mn$^{2+}$ ("SPP")
(Ca,Sr,Ba,Mg)$_{10}$(PO$_4$)$_6$(F,Cl,Br,OH):Eu$^{2+}$,Mn$^{2+}$("HALO")
(Ca,Sr)$_8$(Mg,Zn)(SiO$_4$)$_4$C$_{12}$:Eu$^{2+}$,Mn$^{2+}$("CASI")
(Ba,Sr,Ca)MgP$_2$O$_7$:Eu$^{2+}$,Mn$^{2+}$
3.5MgO*0.5MgF$_2$*GeO$_2$:Mn$^{4+}$("MFG")

Group 4
(Ca,Sr,Ba,Mg)$_{10}$(PO$_4$)$_6$(F,Cl,Br,OH):Eu$^{2+}$,Mn$^{2+}$ ("HALO")
(Ca,Sr)$_8$(Mg,Zn)(SiO$_4$)$_4$C$_{12}$: Eu$^{2+}$, Mn$^{2+}$("CASI")

In another embodiment, the present invention provides a phosphor layering strategy which improves the lumen output and color stability of LED based lamps by putting phosphors that exhibit lower thermal quenching closer to the LED chip than those that experience higher thermal quenching.

Figure 4:
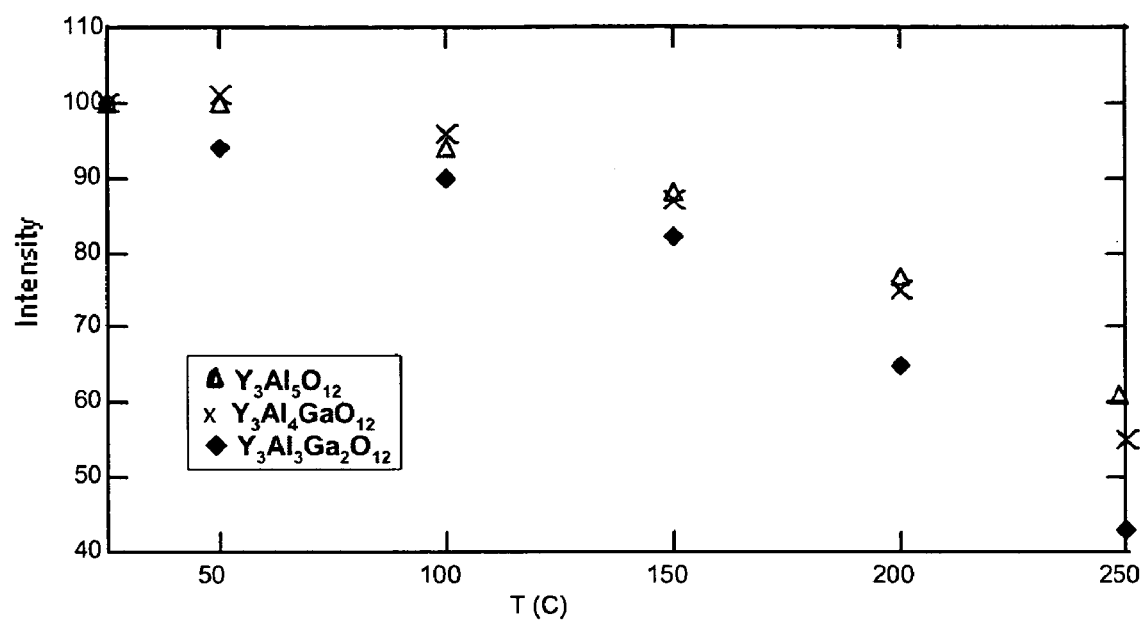
FIG. 4, is a graph showing the thermal quenching of a YAG:Ce phosphors with and without $Ga^{3+}$ as it is heated.

Thermal quenching of phosphor luminescence is a problem in LED based illumination sources. Some of the phosphor particles can be heated to temperatures of ~75° C. or greater. This can lead to significant quenching of the phosphor luminescence, depending upon the phosphor composition and synthesis procedure. For example, as seen in FIG. 4, it can be shown that as the phosphor Y$_3$Al$_5$O$_{12}$:Ce$^{3+}$ is heated, its luminescence declines with a given constant excitation radiation. Further, and with continued reference to FIG. 4, is known that the addition of Ga$^{3+}$ to YAG:Ce$^{3+}$ based phosphors can lead to thermal quenching of the phosphor luminescence. In phosphor blends, differences in the quenching behavior of the component phosphors can lead to shifts in the device color and lower efficiency at higher LED drive currents. The disclosed layering approach can help alleviate this problem in a white LED lamp by putting an initial layer of phosphor that has minimal thermal quenching closer to the LED and subsequently layering phosphors with worse thermal quenching characteristics on top of this layer. This would minimize overall phosphor thermal quenching effects in the device. Thermal quenching characteristics of various phosphors can easily be determined experimentally by heating the phosphors while subjecting them to a constant excitation radiation.

Specific phosphor laydown strategies can thus be devised based on the thermal quenching characteristics of the phosphors and the desired light output characteristics. Phosphors from the lists detailed above may be used, with the laydown order based on thermal quenching characteristics rather than decay time or absorption efficiency. In addition, such a laydown strategy can be used in conjunction with the previously described strategy. Thus, the first phosphor may have a lower thermal quenching, a shorter decay time, and/or a lower absorption of the LED radiation than the second phosphor.

For the present device, the coating thickness of the layers will be dependent upon the desired color point, color temperature, and color rendering index (CRI) for the lamp as well as design of the coating point of each layer for optimal lumens. In general, the device may be designed to achieve a color temperature range of 2500-10,000K and CRIs ranging from 50-99. Advantageously, it has been found that the present invention improves the ability to match any desired color design.

With the foregoing description, examples and figures refer to particular embodiments of the invention, the invention is not intended to be limited thereto. For example, the reference to particular phosphor compositions is not intended to be limited thereto. Similarly, the present invention is also believed to have applicability to additional LED type in addition to GaN types, including organic. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

What is claimed is:

1. A light emitting device comprising a semiconductor light emitter and at least two phosphor materials, wherein a first phosphor material is disposed closer to said semiconductor light emitter than a second phosphor material, said first phosphor material having at least one of a shorter decay time and a lower absorption of radiation emitted from said semiconductor light emitter than said second phosphor material.

2. A device according to claim 1, wherein said semiconductor light emitter comprises a light emitting diode or a laser diode.

3. A device according to claim 1, wherein said semiconductor light emitter emits between about 350 and 440 nm.

4. A device according to claim 1, wherein said first phosphor material is disposed in a matrix material and applied to the LED as a layer.

5. A device according to claim 4, wherein said matrix material is selected from silicone, epoxy and mixtures thereof.

6. A device according to claim 1, further comprising one or more additional phosphor materials.

7. A device according to claim 1, wherein said first phosphor material has at least one of a luminescence decay time of less than about 3 ms and a plaque absorption of less than about 60% at a mean particle size of 10 µm.

8. A device according to claim 1, wherein said second phosphor material has at least one of a luminescence decay time of greater than about 10 ms and a plaque absorption of greater than about 80% at a mean particle size of 10 µm.

9. A device according to claim 1, wherein said first phosphor material comprises phosphors co-activated with $Eu^{2+}$ and $Mn^{2+}$.

10. A device according to claim 1, wherein said first phosphor material comprises $(Sr,Ca,Ba,Mg,Zn)_2P_2O_7:Eu^{2+}, Mn^{2+}$; $Sr_4Al_{14}O_{25}:Eu^{2+}$; or blends thereof.

11. A device according to claim 1, wherein said second phosphor material comprises $(Ca,Sr,Ba,Mg)_{10}(PO_4)_6(F,Cl,Br,OH):Eu^{2+}, Mn^{2+}$.

12. A device according to claim 1, wherein said first phosphor material comprises one or more of $(Ba,Sr,Ca)Al_2O_4:Eu^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Ca,Sr,Ba,Mg)_{10}(PO_4)_6(F,Cl,Br,OH):Eu^{2+}$; $(Ca,Sr)_8(Mg,Zn)(SiO_4)_4Cl_2:Eu^{2+}$; $(Ba,Sr,Ca)MgAl_{10}O_{17}:Eu^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Y,Gd,Tb,La,Sm,Pr,Lu)_3(Al,Ga)_5O_{12}:Ce^{3+}$; and blends thereof.

13. A device according to claim 1, wherein said second phosphor material comprises one or more of $(Ba,Sr,Ca)MgAl_{10}O_{17}:Eu^{2+}, Mn^{2+}$; $(Sr,Ca,Ba,Mg,Zn)_2P_2O_7:Eu^{2+}, Mn^{2+}$; $(Ca,Sr,Ba,Mg)_{10}(PO_4)_6(F,Cl,Br,OH):Eu^{2+}, Mn^{2+}$; $(Ca,Sr)_8(Mg,Zn)(SiO_4)_4Cl_{12}:Eu^{2+}, Mn^{2+}$; $(Ba,Sr,Ca)MgP_2O_7:Eu^{2+}, Mn^{2+}$; $3.5MgO*0.5MgF_2*GeO_2:Mn^{4+}$; $(Ca,Sr,Ba,Mg)_{10}(PO_4)_6(F,Cl,Br,OH):Eu^{2+}, Mn^{2+}$; $(Ca,Sr)_8(Mg,Zn)(SiO_4)_4Cl_{12}:Eu^{2+}, Mn^{2+}$; and blends thereof.

14. A device according to claim 1 having a color temperature between about 2,500 k and 10,000 k.

15. A device according to claim 1 having a CRI of at least 50.

16. A light emitting device comprising a light emitting diode or laser emitting diode and at least two phosphor materials, wherein a first phosphor material is positioned such that radiation emitted from said light emitting diode or laser emitting diode strikes said first phosphor material prior to striking said second phosphor material, and further wherein said first phosphor material has at least one of a shorter decay time and a lower absorption of radiation emitted from said light emitting diode or laser emitting diode than said second phosphor material.

17. A light emitting device according to claim 16, wherein said first phosphor material has a lower thermal quenching than said second phosphor material.

* * * * *